United States Patent [19]
Lee et al.

[11] Patent Number: 6,101,253
[45] Date of Patent: Aug. 8, 2000

[54] ULTRA-SLIM TELEPHONE SET

[75] Inventors: Chul Hyoung Lee; Kwang Ho Shin, both of Seoul, Rep. of Korea

[73] Assignee: Y.T.C. Telecom. Co., Ltd., Seoul, Rep. of Korea

[21] Appl. No.: 09/081,221

[22] Filed: May 19, 1998

[30] Foreign Application Priority Data

May 1, 1998 [KR] Rep. of Korea ...................... 98-15785

[51] Int. Cl.[7] ....................................................... H04M 1/00
[52] U.S. Cl. ........................................... 379/433; 379/429
[58] Field of Search ................................... 379/433, 428, 379/429, 430; 455/90, 575

[56] References Cited

U.S. PATENT DOCUMENTS

| | | |
|---|---|---|
| 4,490,579 | 12/1984 | Godoshian . |
| 4,754,484 | 6/1988 | Larkin et al. ............................ 379/430 |
| 5,271,056 | 12/1993 | Pesola et al. ............................ 379/433 |

*Primary Examiner*—Jack Chiang
*Attorney, Agent, or Firm*—Merchant & Gould P.C.

[57] ABSTRACT

Disclosed is an ultra-slim telephone set in which a plurality of circuit elements of telephone are mounted on both sides of the PCB in a multi-layer manner so as to reduce the telephone body and the handset is made earphone-typed to be hung in one of ears and can be separated/attached from/to the body with the use of the phone jack so as to make the size of the top side of the telephone be as small as a keypad, so that the telephone set can be hand-held and mobile making the user who especially may have to work with both hands have an improved work environment. The present invention provides the telephone set having an ultra-slim body comprising a first small and double-sided PCB whose structure is configured to have a plurality of telephone circuit elements in a manner of multi-layer, a second small and double-sided PCB in which a plurality of keys for entering telephone numbers as well as for selecting a desired function are mounted, positioned above the first small and double-sided PCB, a case for covering the first and the second PCB as one, of which the plurality of keys are placed on the top side and a connecting means for connecting a handset located at the side of the case and for connecting a telephone line located at the rear side of the case. The present invention further provides a handset comprises a connection means corresponding to the handset connection means, which can be separated/attached from/to the ultra-slim body, and also comprises a microphone and a speaker for respectively input/output of voice signals and amplifiers for respectively the input voice signals and the output voice signals, and both of which are combined as one in a case such that the speaker portion can be attached to one of ears.

7 Claims, 4 Drawing Sheets

ULTRA-SLIM TELEPHONE SET

BACKGROUND OF THE INVENTION

1. Field of the Invention

The present invention relates to an ultra-slim telephone set whose body is made amazingly small, and more particularly to the ultra-slim telephone set whose body is made small by having small and double-sided PCBs(printed circuit boards) including a plurality of circuit elements of a telephone in a multi-layer manner, and whose handset is made possible to be hung in one ear(earphone-type) when making or receiving a call, resulting in that the telephone body can be such small sized as having only key matrix to be hand-held and convenient to carry along, and resulting in that a user is capable of using his/her hands freely for other tasks.

2. Description of the Prior Art

In the past, a general telephone comprised a hook switch for connecting on/off a telephone line, a handset, a key matrix including a plurality of keys for entering telephone numbers and for selecting a desired function, a dual tone multiple frequency (hereinafter, referred to as DTMF) means for generating a dial tone corresponding to a frequency of selected key arranged in the key matrix, a ring detecting means for detecting a ring signal or DTMF tones coming through the telephone line for outputting a corresponding ring detection signal when it is detected, a control means either for converting an electrical signal coming through the telephone line to a voice signal and transmitting the voice signal to the telephone receiver, or for converting a voice signal coming through a telephone transmitter to the electrical signal and transmitting the electrical signal to the telephone line, a handset connection means for either transmitting the voice signal outputted from the control means to the telephone receiver, or for transmitting the voice signal coming through an external telephone transmitter to the control means, and a telephone line connection means for connecting the telephone line such that communication with a telephone network is possible to do and that it is capable of detecting a ring signal transmitted from the telephone network.

Such a conventional telephone set, however, is moderately sized, and particularly in the case that the telephone set is wired, its handset is normally mounted on the top of the body so as to be capable of controlling the hook switch so that there is needed a place to put that in and there exists various inconveniences, for example, the user is not capable of performing another task at the same time when he/she makes or receives a call since he/she may hold the handset.

SUMMARY OF THE INVENTION

The need for solving the disadvantages described above is generated and the object of the present invention is to provide an ultra-slim telephone set whose body is made small by having small and double-sided PCBs including a plurality of circuit elements of a telephone in a multi-layer manner, and whose handset is made possible to be hung in one ear(earphone-type) by being capable of connecting to or separating from the body with a phone jack when making or receiving a call, resulting in that the telephone body can be such small sized as having only key matrix to be hand-held and convenient to carry along, and resulting in that a user is capable of using his/her hands freely for other tasks, To achieve the above-mentioned objective, in one aspect the present invention provides a telephone set for having an ultra-slim body comprising; a first small and double-sided PCB whose structure is configured to have a plurality of telephone circuit elements in multi-layer manner; a second small and double-sided PCB in which a plurality of keys for entering telephone numbers as well as for selecting a desired function are mounted, positioned above the first small and double-sided PCB ; a case for covering the first and the second PCB as one, of which the plurality of keys are placed on the top side; a connecting means for connecting a handset located at the side of the case and for connecting a telephone line located at the rear side of the case and; an earphone-type handset comprising a connection means, a microphone and a speaker.

The present invention, in another aspect, provides the telephone set wherein the first PCB whose structure is configured to be multi-layered; a plurality of small telephone circuit elements are at first placed with an integrated thin film chip of resistor on the top side of the first PCB; integrated elements as well as medium sized elements such as a connector, an audio jack and a switch are secondly placed on the rear side of the first PCB; and telephone circuit elements whose legs are longest such as a capacitor and crystal are finally placed on the top of the elements which are secondly laid down on the rear of the first PCB, resulting in that the size required by the PCB of the telephone becomes smaller.

The present invention ,in another aspect, provides the telephone set wherein the ultra-slim body is connected to two double-sided PCB with a use of a flattened cable and its connected connector.

The present invention, in another aspect, provides the telephone set wherein the ultra-slim body can be attached to a bed, a monitor of a personal computer, computer body, and a computer keyboard.

The present invention, in another aspect, provides the telephone set whose the earphone-typed handset comprises; a connection means corresponding to the general handset connection means, which can be separated/attached from/to the ultra-slim body; a microphone and a speaker for respectively input/output of voice signals and amplifiers for respectively the input of voice signals and the output of voice signals; and a earphone-type case for covering the microphone and the speaker which are combined as one such that the speaker portion can be attached to one ear.

The present invention, in another aspect, provides the telephone set wherein the microphone of the handset has an amplification resistor at an input stage whose resistance value is set between 180 k$\Omega$ and 250 k$\Omega$ so as to increase the input sensitivity at the microphone.

The present invention, in another aspect, provides the telephone set wherein the microphone of the handset has a sensitivity resistor at an input stage whose resistance value is set as 330 $\Omega$ so as to reduce the noise at the input stage of the microphone.

The present invention, in another aspect, provides the telephone set wherein the speaker of the handset has an amplification resistor at an output stage of which the resistance value is set as 22 k$\Omega$ so as to reduce an amplification gain at the output stage of the speaker.

Both the following description of the drawings and the following preferred embodiment are exemplary and explanatory only, and do not restrict the invention as claimed.

BRIEF DESCRIPTION OF THE DRAWINGS

The above object and other advantages of the present invention will become more apparent by describing in detail the preferred embodiment thereof with reference to the attached drawings, in which.

DESCRIPTION OF THE PREFERRED EMBODIMENT

Hereinafter, a preferred embodiment of the ultra-slim telephone set according to the present invention will be described in detail with reference to the accompanying drawings.

Figure 1:
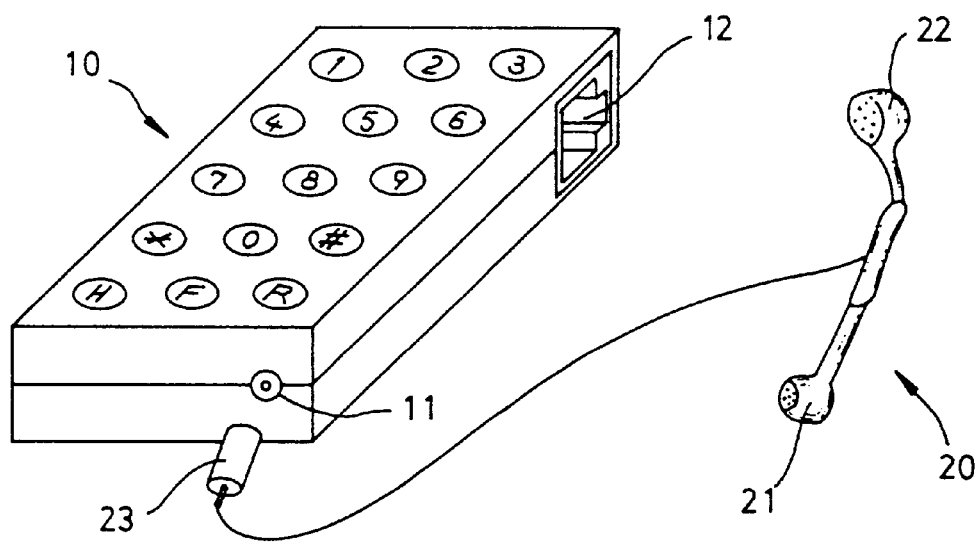
FIG. 1 is a side elevational view of illustrating an embodiment of an ultra-slim telephone set according to the present invention.

FIG. 1 is a side elevational view illustrating an embodiment of an ultra-slim telephone set according to the present invention. Referred to FIG. 1, the ultra-slim telephone set includes an ultra-slim body 10 sized to mount only a keypad having a plurality of keys for entering telephone numbers and for selecting a desired function on its entire top side, in the front face of the case and in the side of the case respectively an audio jack 11, a telephone line connection jack 12, and an earphone-type handset 20 including a phone jack 23 for connecting the earphone-type handset to the body or separating it from the body, and a microphone 21 and a speaker 22 for amplifying inputting/outputting voice signals respectively. All of the above-mentioned elements of the earphone-type handset are covered with a case in one, resulting in that the earphone-type handset can be hung in one ear of the user when making/receiving a call.

Herein, the ultra-slim telephone body is shown to comprise on the top side of the case a plurality of keys, a hook key for controlling hook ON/OFF with the use of toggle switch, a lamp(F) for externally indicating the state of the hook ON/OFF, a re-dial key(R) for selecting a re-dial function, as well as in the front face of the case and in the side of the case respectively an audio jack 11 for transmitting an audio input/output of the handset, a telephone line connection jack 12 for connecting the telephone circuit.

It is also shown that the earphone-type handset 20 comprises a phone jack 23 for connecting to the audio jack of the ultra-slim telephone body, a microphone 21 for amplifying a voice signal inputted externally, and a speaker 22 for amplifying signals upon the receipt of either the voice signal transmitted from the ultra-slim telephone body or the external voice signal transmitted from the microphone, and it is shown that the speaker portion of the earphone-type handset is made to be inserted into the ear, and the other end portion of the earphone-typed handset is mike-shaped, and in which the speaker and the microphone are arranged together as being one with the use of a case.

Figure 2:
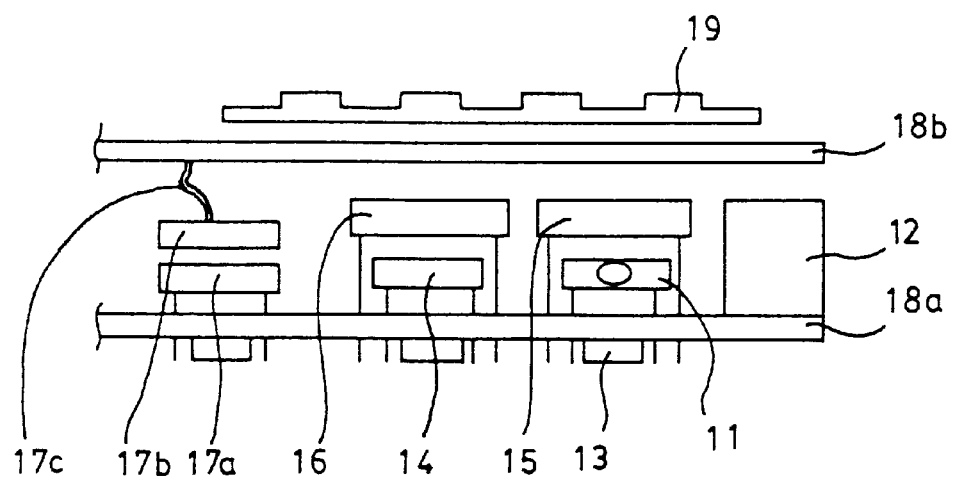
FIG. 2 is a cross sectional view of illustrating an embodiment of the multi-layer structured ultra-slim telephone body block shown in FIG. 1.

FIG. 2 is a cross sectional view illustrating an embodiment of the multi-layer structure containing a plurality of corresponding circuit elements a of telephone required to make the ultra-slim telephone body block shown in FIG. 1. Referring to FIG. 2, the multi-layer structure of the internal circuit contained in the ultra-slim telephone body is shown to be such that a plurality of small circuit elements of the telephone are at first placed with an integrated thin film chip of resistor 13 on the top side of the first small and double-sided PCB 18a, integrated elements(IC)14 as well as medium sized elements such as a connector 17a, and an audio jack 11, are secondly placed on the rear side of the first small double-sided PCB 18a, and circuit elements of the telephone whose legs are longest, such as a capacitor 15 or a crystal 16 are finally placed on the top of the elements which are secondly laid down on the rear side of the first small and double-sided PCB 18a. Of course, it can be easily known that the number of layer used in this multi-layer structure of the internal circuit can be more than three.

The telephone line connection jack 12 is also included being separate from the multi-layered PCB 18a upon the consideration of its volume. A plurality of keys for entering telephone numbers and for selecting a desired function are mounted on the second small and double-sided PCB 18b which is placed above the first PCB 18a, keeping some distance away. The first PCB 18a and the second PCB 18b are made one with the use of a case. It is illustrated that the ultra-slim telephone body 10 has a structure of comprising a plurality of circuit elements of the telephone mounted on each other in multi-layer, and the second PCB 18b includes the plurality of keys which are on the top side of the second PCB 18b and are projected above the top side of the case for being capable of performing switching functions of the plurality of keys in the keypad when they are pushed down. The ultra-slim body also comprises both an audio jack 11 located on the front side of the case for being connected to the handset, and a telephone line connection jack 12 located on the side of the case for being connected to the telephone circuit.

Figure 3:
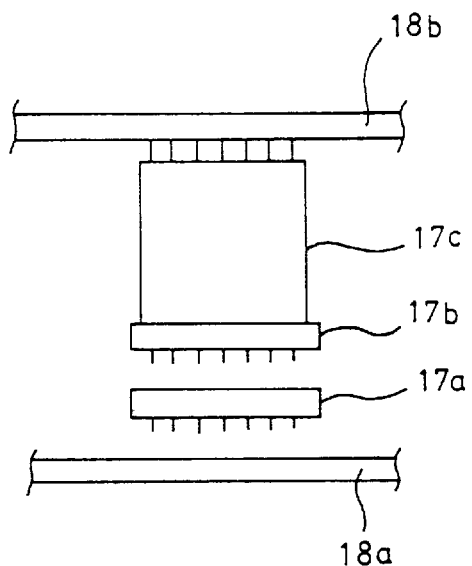
FIG. 3 is a cross sectional view of illustrating connection between upper PCB(the second PCB) and bottom PCB(the first PCB) in the multi-layer structure.

FIG. 3 is a cross sectional view illustrating connection between upper PCB (the second PCB) and bottom PCB(the first PCB) in the multi-layer structure. Referring to FIG. 3, it is shown that the first PCB 18a and the second PCB 18b are electronically connected via a flattened cable 17c with the use of a first connector 17a and a second connector 17b. The first connector 17a is connected to the bottom side of the first PCB 18a, and the flattened cable 17c joined with the second connector 17b is directly brazed to the upper side of the second PCB 18b. The second connector 17b is also connected to the first connector 17a which is to be connected to the first PCB 18a.

Figure 4A:
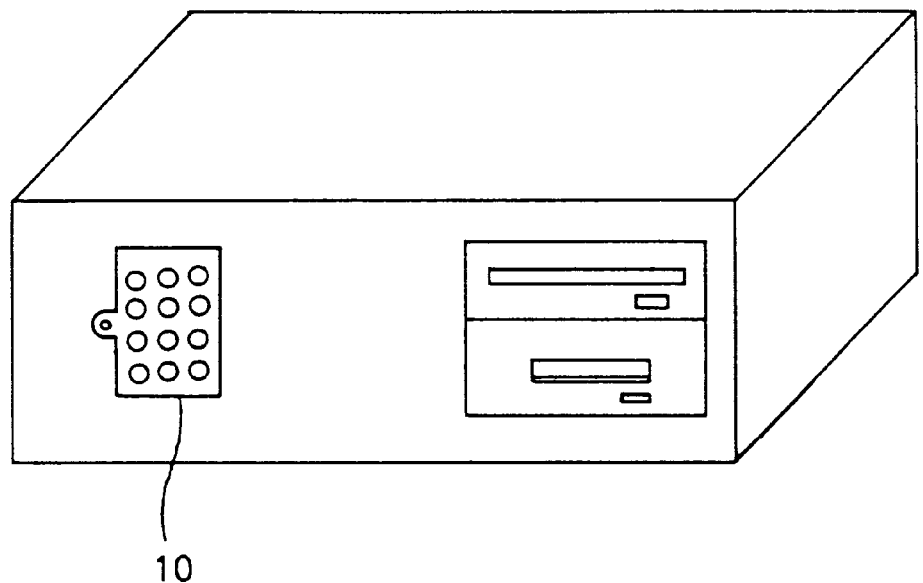
FIG. 4a and FIG. 4b illustrate applications of the ultra-slim telephone body, such as attachment to a monitor and a hard drive of a personal computer respectively.
Figure 4B:
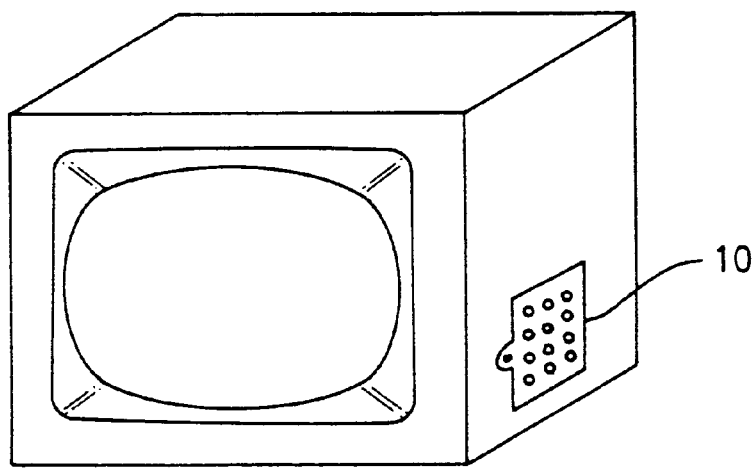

FIG. 4a and FIG. 4b illustrate application of the ultra-slim telephone body, such as attached to a monitor and a hard drive of a personal computer respectively. Further, it can be easily known that the ultra-slim telephone body can be attached in a bed or other applications.

Figure 5:
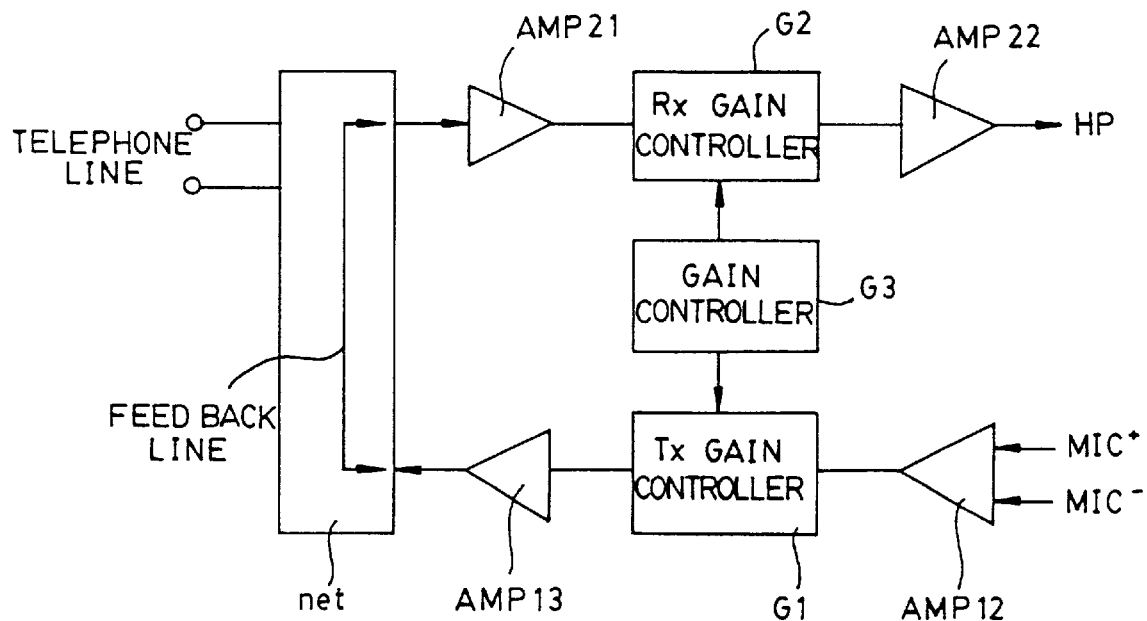
FIG. 5 is a block diagram of the connection means for transmitting a voice signal from the ultra-slim body to the earphone-type handset.

FIG. 5 is a block diagram of the connection means for transmitting a voice signal from the ultra-slim body to the earphone-type handset. Referring to FIG. 5, the connection means comprises a telephone line network NET for transmitting the signals received through the telephone line to the audio jack, and for transmitting the signals received from the audio jack to the telephone line and for feeding back the same signals to the audio jack at the same time, input/output amplifiers AMP21, AMP22 located at the voice input stage for amplifying the signals received from the audio jack, input/output amplifiers AMP 12, AMP 13 located at the voice output stage for amplifying the signals to be transmitted to the audio jack, and gain controllers G1, G2, G3 located at the input/output stage for controlling gains of the signals received from the amplifiers 23, 12 so as to transmit the processed signal to the amplifiers 22, 13 so that the sound signals inputted to microphone can be feedback to the amplifier of the receiver stage via the amplifier of the transmitter stage resulting in that the user can hear himself/herself and at the same time the same signal can be received by a caller or receiver.

Figure 6A:
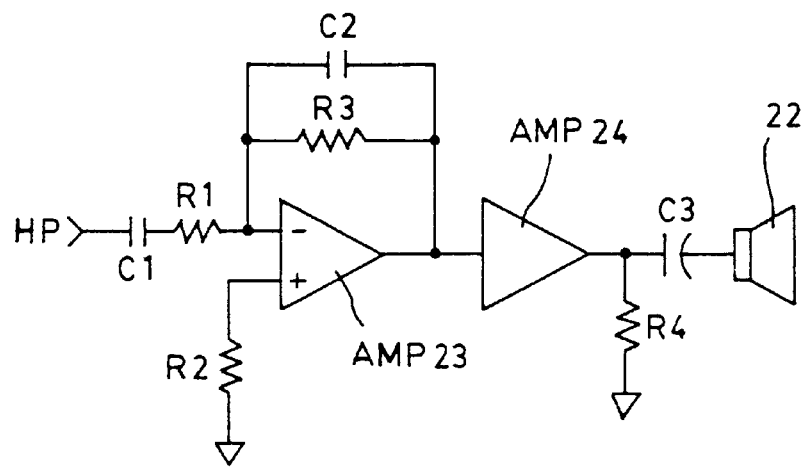
FIG. 6a and FIG. 6b are circuit diagrams of the output amplifier stage of a speaker and the input amplifier stage o f a microphone, both of which are included in the earphone-type handset.
Figure 6B:
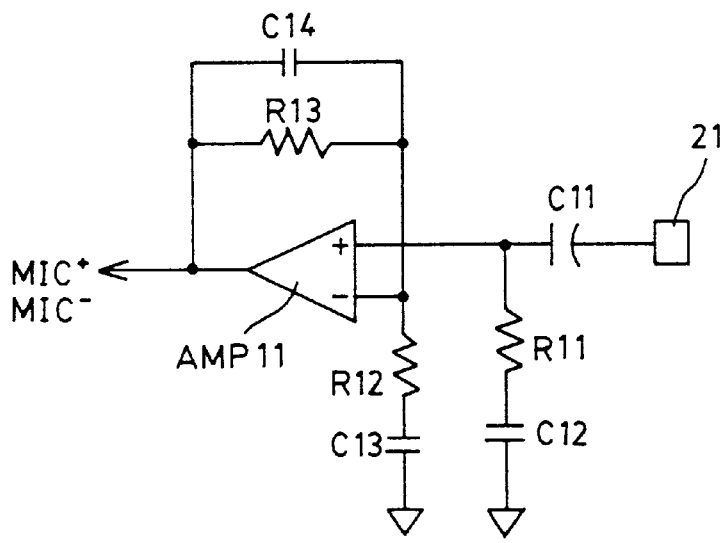

FIG. 6a and FIG. 6b are circuit diagrams of the output amplifier stage of a speaker and the input amplifier stage of a microphone, both of which are included in the earphone-type handset. Referring to FIG. 6a, and FIG. 6b, each of the output amplifier stage of the speaker and the input amplifier stage of the microphone comprises a plurality of amplifiers AMP23, AMP 24, AMP11, and the gain controlling elements R1–R4, R11–R13, C1–C3, C11–C14, connected to the amplifiers. Herein, as the speaker mentioned above is shaped like an earphone and is attached to an ear, the amplifying gain at the output stage of the speaker can be a little bit lower than that of the output stage of the general speaker (the resistance value of the amplification resistor R3: 33 kΩ and the resistance value of the sensitivity resistor R4: 330 Ω), preferably setting the resistance value of the amplification resistor R3 be 22 kΩ and making the resistance value of the sensitivity resistor R4 to be 300 Ω. Further, as the microphone mentioned above is located a little bit away from the mouth bringing the result that the sound cannot be transmitted fully, the amplifying gain at the input stage of the microphone may have to be a little bit higher than that of the input stage of the general microphone (the resistance value of the amplification resistor R13 100 kΩ, and the resistance value of the sensitivity resistor R11 100 kΩ), preferably setting the resistance value of the amplification resistor R13 to be between 180 and 250 kΩ, and setting the resistance value of the sensitivity resistor R11 to be 330 Ω, so as to reduce the noise at the input stage of the microphone.

Hereinafter, the operation and the effect of the present invention as mentioned above will be described as follows.

First of all, the earphone-type handset 20 of the present invention comprises a microphone 21 for amplifying a voice signal upon the receipt of the external voice signal, a speaker 22 located a little bit away from the microphone for amplifying both the voice signal transmitted from the telephone line and the external voice signal transmitted from the microphone upon the receipt of those signals and for outputting the amplified signal s, and a phone jack 23. While all of the elements comprising the earphone-type handset are joined together as one with a case, one end of the handset (the speaker portion) is made like an earphone to be inserted into an ear and the other end portion of the handset is shaped like a mike.

The ultra-slim body 10 has a multi-layer structure such that a plurality of small circuit elements of a telephone are at first placed with an integrated thin film resistor 13 on the top side of the first small and double-sided PCB, integrated elements(IC) as well as medium sized elements such as a connector, and an audio jack 11, are secondly placed on the rear side of the first small and double-sided PCB, and circuit elements of the telephone whose legs are longest, such as a capacitor or a crystal are finally placed on the top of the elements which are secondly laid down on the rear side of the first small and double-sided PCB 18a. This makes the volume of the first small and double-sided PCB be reduced. The ultra-slim body also includes a second small and double-sided PCB 18b on which a switch control keypad 19 for controlling a plurality of keys of entering telephone numbers and of selecting a desired function. The first PCB and the second PCB are mounted on top of each other, and are cased together, and the switch control keypad is projected on the top of the case of the ultra-slim body. The ultra-slim body also comprises an audio jack 11 for connecting a handset to the portion on the front side of the case, and a telephone line connection jack 12 for connecting a telephone line to the portion on the side of the case so that the earphone-type handset and telephone line are connected to each other. As a result of the configuration described as above, the telephone body can be very small.

However, the microphone of the typical handset is shaped such that the sound volume can be received fully. As the ultra-slim telephone set of the present invention may have to use the earphone-type handset whose microphone accordingly receives only small portion of sound, the present invention in particular, has to put the importance on the sound volume and sound quality at the microphone. (Of course, the bigger the microphone becomes, the bigger the sound to be received at the microphone. However, there follows inconvenience along as well when a user uses the handset.) In the event that the amplification gain at the input stage of the microphone according to the present invention should be increased to almost infinity, the distortion of the sound signals occurs. It is an objective of the present invention to avoid such a problem. In particular, it is the main objective of the present invention to apply an appropriate tradeout between a signal amplification and a signal distortion.

The amplification gains currently selected at the input stage of the microphone and at the output stage of the speaker are achieved by having resistance values of the amplification resistors, 50~390 kΩ, 33 kΩ respectively. In the event that a higher gain than those are desired, the hauling effect can be occurred, since the sound volume gets too big. Besides, as the present invention is earphone-typed such that the microphone is inserted into the ear, the gain should be made to be lower (by using 22 kΩ amplification resistor) than that of the typical telephone so as to have small ringing effect so that the user does not feel uncomfortable caused from the ringing effect. Further, this invention may have to use the microphone having higher sensitivity than that of the typical telephone (it is found that 58 dB is most preferable in the measurement; 180–250 kΩ), so that the noise at the side of the condenser microphone is not generated.

According to the present invention described above, the plurality of telephone circuit elements are mounted on both sides of the PCB in a multi-layer manner so as to reduce the telephone body and the handset is made earphone-typed to be hung in one ear and can be separated/attached from/to the body with the use of the phone jack so as to make the size of the top side of the telephone be as small as a keypad, so that the telephone set can be hand-held and mobile making the user who especially may have to work with both hands have an improved work environment.

What is claimed is:

1. A telephone set having ultra slim body comprising:
   a first small and double-sided PCB in which a plurality of telephone circuit elements are mounted;
   a second small and double-sided PCB in which a plurality of keys for entering telephone numbers and selecting a desired function are mounted, the second PCB being positioned above the first PCB;
   a case for covering the first and second PCBs in one body, a plurality of the keys being exposed through the case;

connecting means for connecting a handset located at a side of the case and connecting a telephone line located at a rear side of the case; and an earphone handset having a connector a microphone and a speaker, wherein the first PCB comprises;

small elements and film elements positioned in a first layer on the first PCB;

medium sized elements such as a connector, an audio jack and a switch positioned above the small and film elements on a rear side of the first PCB, the small and film elements being placed between legs of the medium elements; and long elements such as a capacitor and a crystal positioned above the medium elements on the rear of the first PCB, the medium elements being placed between legs of the long elements.

2. The telephone set defined in claim 1, wherein the ultra-slim body is connected to two double-sided PCB with a use of a flatted cable and connectors connected to the flatted cable.

3. The telephone set defined in claim 1, wherein the ultra-slim body can be attached to a bed, a monitor of a personal computer a computer body, and a computer keyboard.

4. The telephone set defined in claim 2, wherein the earphone handset comprises:

connection means corresponding to the connector of the earphone handset, the connection means being detachable to the ultra-slim body;

a microphone and a speaker for inputting/outputting voice signals and amplifiers for amplifying the input voice signals and the output voice signals; and an earphone-typed case for covering the microphone and the speaker which are combined in one body.

5. The telephone set defined in claim 4, wherein the microphone of the handset has an amplification resistor at an input stage whose resistance value is set between 180 k$\Omega$ and 250 k$\Omega$ so as to increase the input sensitivity at the microphone.

6. The telephone set defined in claim 4, wherein the microphone of the handset has a sensitivity resistor at an input stage whose resistance value is set as 330 Ohm so as to reduce the noise at the input stage of the microphone.

7. The telephone set defined in claim 4, wherein the speaker of the handset has an amplification resistor at an output stage whose resistance value is set as 22 k$\Omega$ so as to reduce an amplification gain at the output stage of the speaker.

* * * * *